(12) United States Patent
Inaba et al.

(10) Patent No.: US 10,651,328 B2
(45) Date of Patent: May 12, 2020

(54) SOLAR CELL MODULE

(71) Applicants: KABUSHIKI KAISHA TOYOTA JIDOSHOKKI, Kariya-shi, Aichi-ken (JP); TOYOTA JIDOSHA KABUSHIKI KAISHA, Toyota-shi, Aichi-ken (JP)

(72) Inventors: Hirotaka Inaba, Kariya (JP); Kenichiro Yoshimoto, Tokai (JP)

(73) Assignees: KABUSHIKI KAISHA TOYOTA JIDOSHOKKI, Kariya-shi, Aichi-ken (JP); TOYOTA JIDOSHA KABUSHIKI KAISHA, Toyota-shi, Aichi-ken (JP)

( * ) Notice: Subject to any disclaimer, the term of this patent is extended or adjusted under 35 U.S.C. 154(b) by 0 days.

(21) Appl. No.: 16/091,270

(22) PCT Filed: Apr. 4, 2017

(86) PCT No.: PCT/JP2017/014050
§ 371 (c)(1),
(2) Date: Oct. 4, 2018

(87) PCT Pub. No.: WO2017/175748
PCT Pub. Date: Oct. 12, 2017

(65) Prior Publication Data
US 2019/0131473 A1    May 2, 2019

(30) Foreign Application Priority Data

Apr. 6, 2016 (JP) .................................. 2016-076665

(51) Int. Cl.
*H01L 31/048* (2014.01)
*H01L 31/05* (2014.01)
(Continued)

(52) U.S. Cl.
CPC .......... *H01L 31/048* (2013.01); *H01L 31/042* (2013.01); *H01L 31/0504* (2013.01);
(Continued)

(58) Field of Classification Search
CPC ..................... H01L 31/048; H01L 31/0504
See application file for complete search history.

(56) References Cited

U.S. PATENT DOCUMENTS

| 5,660,646 A | * | 8/1997 | Kataoka | ............ B32B 17/10018 136/244 |
| 2016/0276509 A1 | | 9/2016 | Mitsuzawa et al. | |

FOREIGN PATENT DOCUMENTS

| EP | 2 015 370 A2 | 1/2009 |
| EP | 2 475 012 A1 | 7/2012 |

(Continued)

OTHER PUBLICATIONS

International Search Report of PCT/JP2017/014050 dated Jul. 4, 2017.
(Continued)

*Primary Examiner* — Jayne L Mershon
(74) *Attorney, Agent, or Firm* — Sughrue Mion, PLLC

(57) ABSTRACT

A solar cell module includes: a first cover in the form of an at least partially transparent plate; a second cover disposed opposite the first cover; at least one solar cell disposed between the first cover and the second cover; a sealing material which fills a space between the first cover and the second cover to join them together to thus seal the solar cell; and a terminal as conductors electrically connected to the solar cell and enclosed by the sealing material between the first cover and the second cover, at least one of the first cover and the second cover having a boss as a positioning unit to position the terminal.

3 Claims, 8 Drawing Sheets

(51) Int. Cl.
*H01L 31/042* (2014.01)
*H02S 40/36* (2014.01)
*H02S 10/40* (2014.01)

(52) U.S. Cl.
CPC .......... *H01L 31/0508* (2013.01); *H02S 40/36* (2014.12); *H02S 10/40* (2014.12); *Y02E 10/50* (2013.01)

(56) References Cited

FOREIGN PATENT DOCUMENTS

| | | |
|---|---|---|
| EP | 3 070 749 A1 | 9/2016 |
| JP | 1-137554 U | 9/1989 |
| JP | 6-039935 U | 5/1994 |
| JP | 09-055531 A | 2/1997 |
| JP | H0955531 * | 2/1997 |
| JP | 2005-079170 A | 3/2005 |
| JP | 2005-191479 A | 7/2005 |
| JP | 2009-206231 A | 9/2009 |
| JP | 2009206231 * | 9/2009 |
| JP | 2012-033546 A | 2/2012 |
| JP | 2016-171274 A | 9/2016 |
| WO | 2007/071703 A1 | 6/2007 |

OTHER PUBLICATIONS

Office Action dated Dec. 12, 2016 in U.S. Appl. No. 15/068,803.
Office Action dated Jun. 15, 2017 in U.S. Appl. No. 15/068,803.
Office Action dated Oct. 12, 2017 in U.S. Appl. No. 15/068,803.
Office Action dated Apr. 17, 2018 in U.S. Appl. No. 15/068,803.
Advisory Action dated Jul. 18, 2018 in U.S. Appl. No. 15/068,803.
Notice of Allowance dated Sep. 12, 2018 in U.S. Appl. No. 15/068,803.
Office Action dated Sep. 19, 2016 in U.S. Appl. No. 15/068,803.

* cited by examiner

SOLAR CELL MODULE

CROSS REFERENCE TO RELATED APPLICATIONS

This application is a National Stage of International Application No. PCT/JP2017/014050 filed Apr. 4, 2017, claiming priority based on Japanese Patent Application No. 2016-076665 filed Apr. 6, 2016.

TECHNICAL FIELD

The present invention relates to a solar cell module, and more particularly to a solar cell module mounted on a vehicle.

BACKGROUND ART

Japanese Patent Laying-Open No. 2005-191479 (PTD 1) discloses a structure in which a plurality of solar cells are sealed with a sealing material and have opposite surfaces each provided with a protective member. The solar cell is a single-crystal silicon solar cell having a P type electrode and an N type electrode on a back surface, and a P type electrode and an N type electrode of adjacent solar cells are connected in series via an interconnector. A plurality of connection points connecting the P type electrode and the interconnector are provided along the edge of one side of the solar cell, and a plurality of connection points connecting the N type electrode and the interconnector are provided along the edge of a side facing that side. The plurality of solar cells are disposed such that the P type electrode connection points and the N type electrode connection points are adjacent to each other, and the plurality of P type electrode connection points and the plurality of N type electrode connection points of adjacent solar cells are connected by the interconnector in the form of a single flat plate.

CITATION LIST

Patent Document

PTD 1: Japanese Patent Laying-Open No. 2005-191479

SUMMARY OF INVENTION

Technical Problem

Generally, a solar cell module is formed by successively stacking a sealing material, a solar cell and a sealing material on a protective member, and then a protective member thereon, and performing a lamination process in which heating and pressurization is conducted by a lamination device to cure the sealing material to thereby bring the respective members into close contact with one another.

During the lamination process, the respective members may be displaced or an interconnector may be damaged due to thermal expansion and contraction of a front plate and a back plate. The damage appears noticeably particularly when resin such as polycarbonate is used for the front plate in order to reduce weight.

Thus, the present invention was made to solve the above-described problem, and has an object to provide a solar cell module capable of reliably positioning a conductor in the solar cell module.

Solution to Problem

A solar cell module according to the present invention includes: a first cover in the form of an at least partially transparent plate; a second cover disposed opposite the first cover; at least one solar cell disposed between the first cover and the second cover; a sealing material which fills a space between the first cover and the second cover to join them together to thus seal the solar cell; and conductors electrically connected to the solar cell and enclosed by the sealing material between the first cover and the second cover, at least one of the first cover and the second cover having a positioning unit to position the conductors.

In the solar cell module thus configured, at least one of the first cover and the second cover has the positioning unit to position the conductors, so that the conductors can be reliably positioned.

Preferably, a plurality of the solar cells are connected in a row by the conductors to form a solar cell string, and the positioning unit positions the conductors connected to opposite end portions of the solar cell string. In this case, an outer end portion of the solar cell string is positioned, thereby reliably preventing displacement of the solar cell caused by contraction and expansion of the first cover and the second cover.

Preferably, the first cover includes a colored portion which shields inside of the first cover from outside, and the positioning unit is disposed between the colored portion and the second cover. In this case, the positioning unit is not externally visible, so that an aesthetically pleasing external appearance of the solar cell module can be maintained.

Preferably, the positioning unit is provided integrally with the colored portion. In this case, the positioning unit can be readily manufactured.

Advantageous Effects of Invention

According to the above configuration, the conductors can be reliably positioned using the positioning unit.

DESCRIPTION OF EMBODIMENTS

Figure 1:
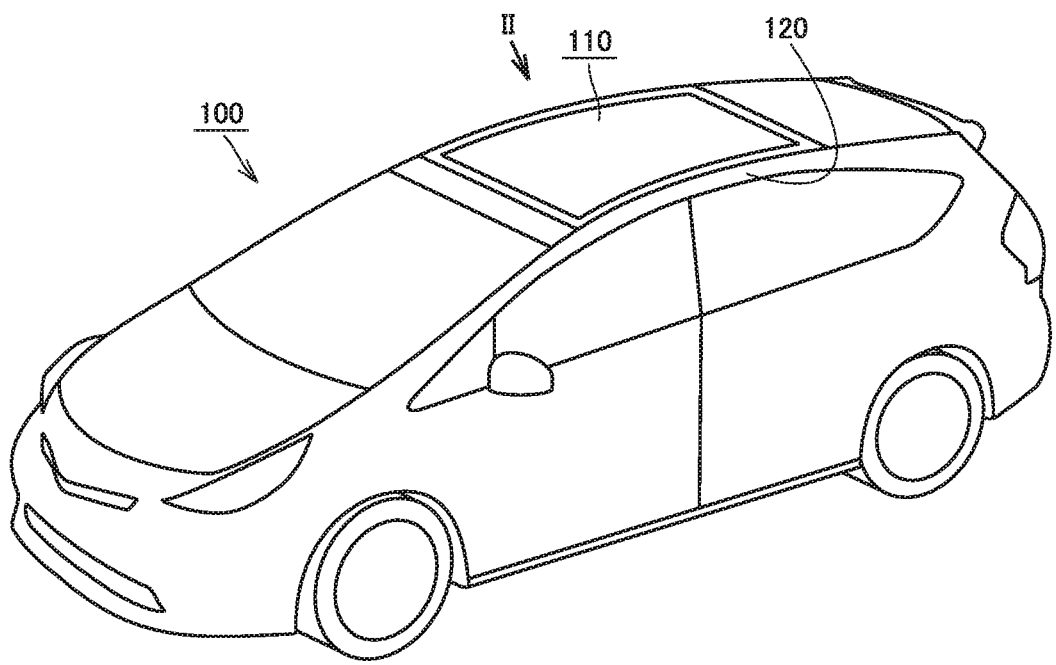
FIG. 1 is a perspective view showing an external appearance of a vehicle according to a first embodiment of the present invention.

A solar cell module, a mounted structure thereof and a vehicle including the solar cell module according to each embodiment of the present invention will be described below with reference to the drawings. In the following description, the same or corresponding parts in the drawings are designated by the same signs and description thereof will not be repeated.

(First Embodiment)

Figure 2:
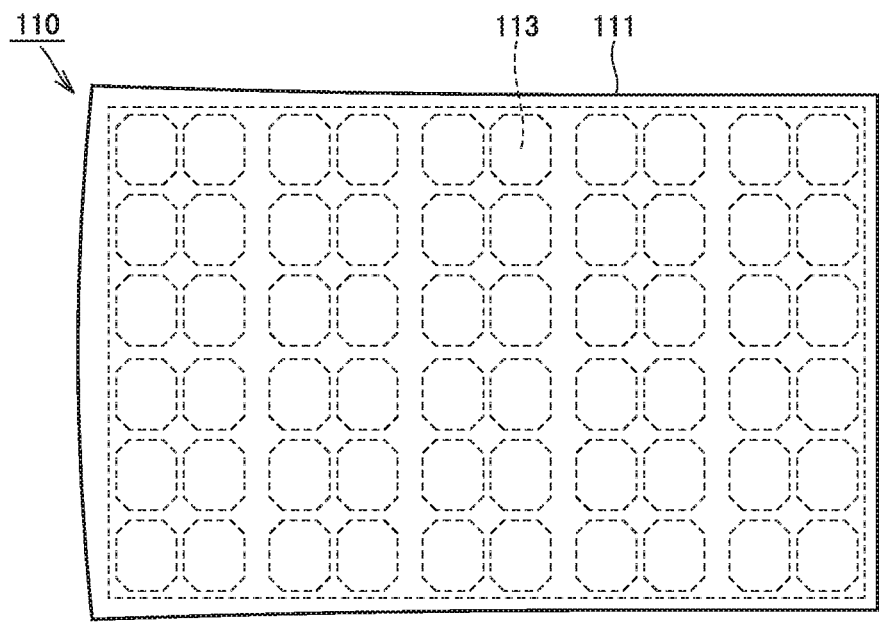
FIG. 2 is a plan view showing an external appearance of a solar cell module included in the vehicle according to the first embodiment of the present invention, as seen from a direction of the arrow II in FIG. 1.
Figure 3:
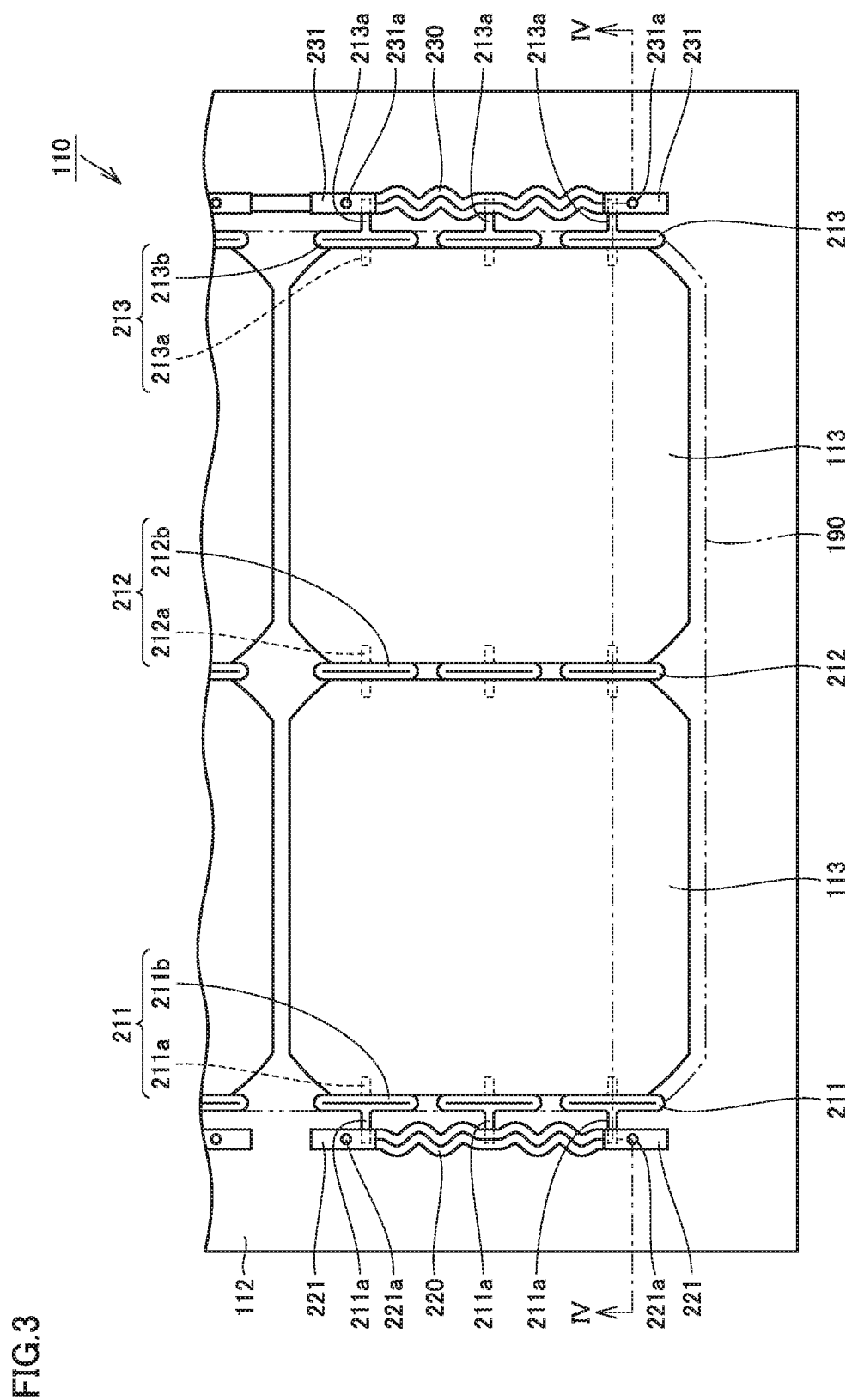
FIG. 3 is a plan view showing an enlarged internal structure of the solar cell module in FIG. 2, with a first cover removed.
Figure 4:
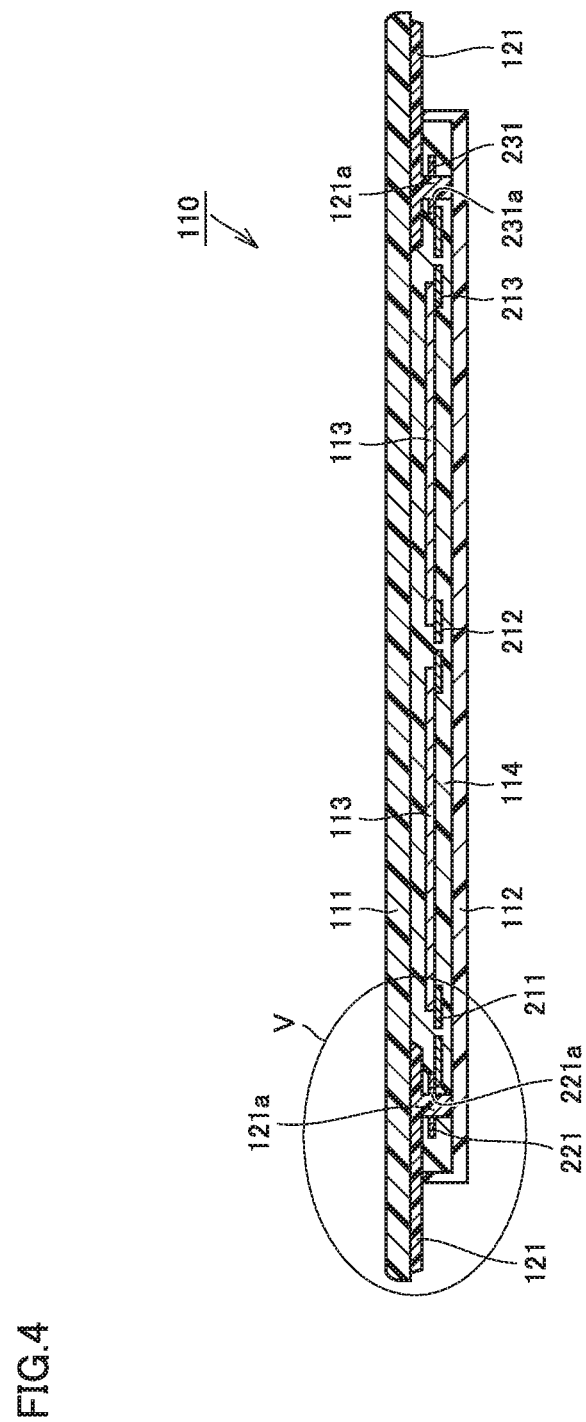
FIG. 4 is a sectional view taken along the line IV-IV in FIG. 3.

FIG. 1 is a perspective view showing an external appearance of a vehicle according to a first embodiment of the present invention. FIG. 2 is a plan view showing an external appearance of a solar cell module included in the vehicle according to the first embodiment of the present invention, as seen from a direction of the arrow II in FIG. 1. FIG. 3 is a plan view showing an enlarged internal structure of the solar cell module in FIG. 2, with a first cover removed. It is noted that only some of solar cells of the solar cell module are illustrated for the sake of simplicity. FIG. 4 is a sectional view taken along the line IV-IV in FIG. 3.

As shown in FIGS. 1 to 4, a vehicle 100 according to the first embodiment of the present invention is an automobile, and includes a solar cell module 110 forming the roof, and a roof side member 120 which is part of the vehicle body. The vehicle is not limited to an automobile, but may be a train, for example.

The solar cell module 110 includes a first cover 111 in the form of a plate serving as a front plate, a second cover 112 disposed opposite the first cover 111 and serving as a back plate, solar cells 113 disposed between the first cover 111 and the second cover 112, and a sealing material 114 which fills a space between the first cover 111 and the second cover 112 to join them together to thus seal the solar cells 113.

The first cover 111 has a substantially rectangular outer shape in plan view. The first cover 111 is a flat plate in the present embodiment, but may be curved. In the present embodiment, the first cover 111 is a plate made of polycarbonate. However, the first cover 111 is not limited thereto, but may be a plate made of another resin such as acrylic. The first cover 111 is formed by injection molding or extrusion molding of polycarbonate.

A portion of the first cover 111 that faces the solar cells 113 is transparent. Sunlight passes through the transparent portion and is applied to the solar cells 113. A portion of the first cover 111 that does not face the solar cells 113 may be rendered opaque by providing a colored portion 121. The inside of the first cover 111 can be shielded, and wires and adhesives around the solar cells 113 can be covered by the opaqueness. The colored portion 121 blocks visible light. A color of the colored portion 121 is not limited to a chromatic color such as red, yellow, green, blue or purple, but may be an achromatic color such as white, gray or black, as long as it is not transparent.

The second cover 112 has a substantially rectangular outer shape in plan view. The second cover 112 is in the form of a flat plate in the present embodiment, but is curved with substantially the same curvature as the first cover 111 when the first cover 111 is curved.

In the present embodiment, the second cover 112 is a plate made of polycarbonate. However, the second cover 112 is not limited thereto, but may be a plate made of another resin such as acrylic, a plate made of CFRP (carbon-fiber-reinforced plastic) or a plate made of metal such as aluminum, or may be a sheet made of resin such as polyethylene terephthalate.

The second cover 112 is formed by injection molding of polycarbonate. The second cover 112 may be transparent or opaque.

The plurality of solar cells 113 are arranged in a matrix at a distance from one another. The plurality of solar cells 113 are electrically connected to one another. Specifically, the plurality of solar cells 113 arranged in a row are connected in series with one another to form a solar cell string. A plurality of solar cell strings are connected in parallel to one another.

The sealing material 114 is located in a region sandwiched between the first cover 111 and the second cover 112. The sealing material 114 is in contact with the first cover 111, the second cover 112 and the solar cells 113.

In the present embodiment, the sealing material 114 is made of EVA (Ethylene-Vinyl Acetate). However, a material constituting the sealing material 114 is not limited to the EVA, but may be PVB (Poly Vinyl Butyral), silicone resin, ionomer resin or the like.

Interconnectors 211, 212 and 213 are provided among the plurality of solar cells 113. The interconnectors 211, 212 and 213 have pairs of legs 211a, 212a and 213a, respectively, and flexible portions 211b, 212b and 213b provided between the pairs of legs 211a, 212a and 213a, respectively.

The pairs of legs 211a, 212a and 213a are connected to the flexible portions 211b, 212b and 213b, respectively.

One leg 211a is connected to a terminal 221 or a tab line 220. The other leg 211a is connected to the solar cell 113. One leg 212a and the other leg 212a are connected to the solar cells 113. One leg 213a is connected to the solar cell 113. The other leg 213a is connected to a terminal 231 or a tab line 230.

A pair of terminals 221 is provided with a through hole 221a. A pair of terminals 231 is provided with a through hole 231a.

The pair of terminals 221 and the tab line 220 connected to the pair of terminals 221 are disposed on the second cover 112. The pair of terminals 221 and the tab line 220 are connected to the legs 211a by welding.

The pair of terminals 231 and the tab line 230 connected to the pair of terminals 231 are disposed on the second cover 112. The pair of terminals 231 and the tab line 230 are connected to the legs 213a by welding.

The flexible portions 211b, 212b and 213b each have a readily deformable shape. The flexible portion 211b is deformed when the distance between the pair of legs 211a changes. The flexible portion 212b is deformed when the distance between the pair of legs 212a changes. The flexible portion 213b is deformed when the distance between the pair of legs 213a changes.

A chain-double-dotted line 190 in FIG. 3 indicates the boundary between the colored portion and the transparent portion. The solar cells 113 are located on the inner side of the chain-double-dotted line 190. The solar cells 113 are located under the transparent portion of the first cover 111. The tab lines 220 and 230 are located under the colored portion of the first cover 111.

Figure 5:
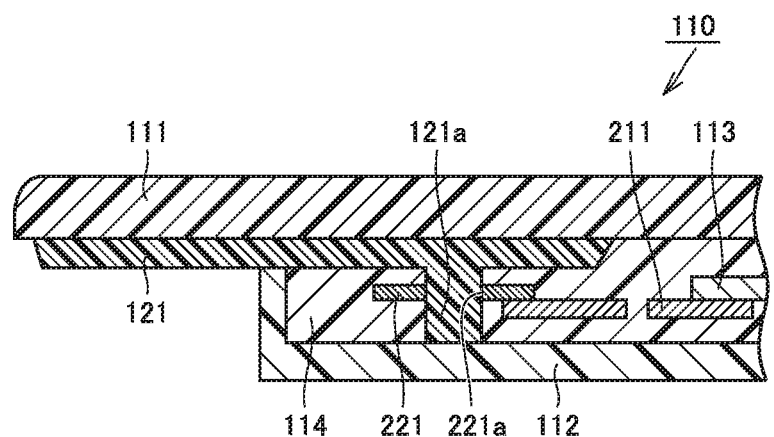
FIG. 5 is a sectional view showing an enlarged portion enclosed by V in FIG. 4.

As shown in FIGS. 4 and 5, the sealing material 114, the solar cell 113, the first cover 111, and the colored portion 121 forming part of the first cover 111 are provided on the second cover 112.

The colored portion 121 is formed, on the surface of the first cover 111 facing the second cover, as one piece by two-color molding in the form of a frame around the periphery. The colored portion 121 is provided with bosses 121a. One boss 121a is inserted in the through hole 221a. The other boss 121a is inserted in the through hole 231a. The bosses 121a are in contact with the second cover 112. The colored portion 121 is not limited to be provided around the periphery of the first cover 111, but may be provided at any other portion that does not face the solar cells 113.

Although the bosses 121a are provided on the colored portion 121 forming part of the first cover 111 in this embodiment, the bosses 121a may be provided on the second cover 112. Alternatively, the bosses 121a may be provided separately from the first cover 111 and the second cover 112.

The solar cell module 110 according to the first embodiment includes: the first cover 111 in the form of an at least partially transparent plate; the second cover 112 disposed opposite the first cover 111; the at least one solar cell 113 disposed between the first cover 111 and the second cover 112; the sealing material 114 which fills a space between the first cover 111 and the second cover 112 to join them together to thus seal the solar cell 113; and the terminals 221 and 231 as conductors electrically connected to the solar cells 113 and enclosed by the sealing material 114 between the first cover 111 and the second cover 112, the first cover 111 having the bosses 121a as positioning units to position the terminals 221 and 231.

The plurality of solar cells 113 are connected in a row by the interconnectors 212 to form a solar cell string, and the bosses 121a position the terminals 221 and 231 connected via the interconnectors 211 and 213 to opposite end portions of the solar cell string, respectively. The bosses 121a may position the tab lines 220 and 230 or the interconnectors 211 and 213 serving as conductors.

The first cover 111 includes the colored portion 121 which shields inside of the first cover from outside, and the bosses 121a are disposed on the inner side of the colored portion 121. The bosses 121a are provided integrally with the colored portion 121.

Figure 6:
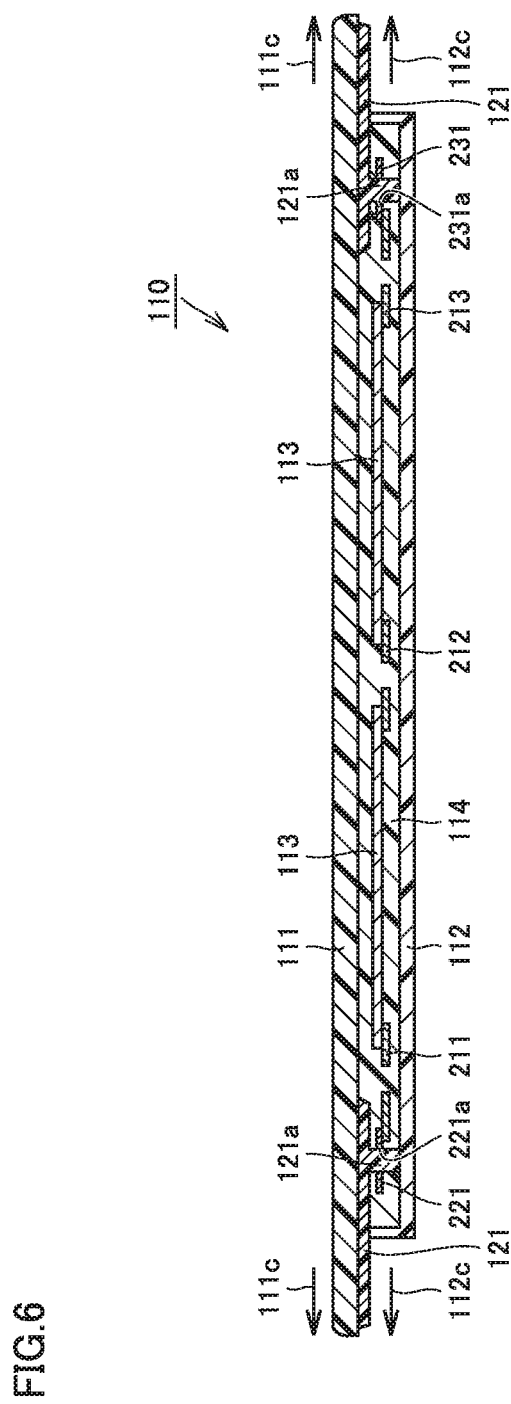
FIG. 6 is a sectional view of the solar cell module in an expanded state according to the first embodiment of the present invention.

FIG. 6 is a sectional view of the solar cell module in an expanded state according to the first embodiment of the present invention. Referring to FIG. 6, during a lamination process, the first cover 111 and the second cover 112 are heated to approximately 140° C. As a result, the first cover 111 expands in a direction indicated by an arrow 111c, and the second cover 112 expands in a direction indicated by an arrow 112c. The distance between the through hole 221a and the solar cell 113, the distance between the pair of solar cells 113, and the distance between the through hole 231a and the solar cell 113 are increased. As a result, the interconnectors 211, 212 and 213 are deformed.

During the expansion, since the bosses 121a are inserted in the through hole 221a and the through hole 231a, the through hole 221a and the through hole 231a move with the first cover 111.

Figure 7:
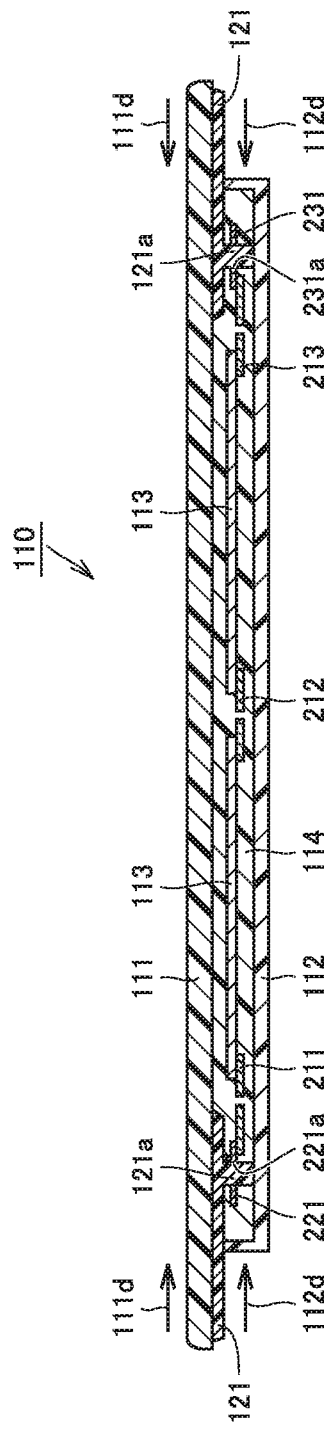
FIG. 7 is a sectional view of the solar cell module in a contracted state according to the first embodiment of the present invention.

FIG. 7 is a sectional view of the solar cell module in a contracted state according to the first embodiment of the present invention. Referring to FIG. 7, after the lamination process, the temperature of the solar cell module 110 is lowered to room temperature (approximately 20° C.). As a result, the first cover 111 contracts in a direction indicated by an arrow 111d, and the second cover 112 contracts in a direction indicated by an arrow 112d. As a result, the distance between the through hole 221a and the solar cell 113, the distance between the pair of solar cells 113, and the distance between the through hole 231a and the solar cell 113 are shortened. The interconnectors 211, 212 and 213 are deformed.

During the contraction, since the bosses 121a are inserted in the through hole 221a and the through hole 231a, the through hole 221a and the through hole 231a move with the first cover 111. As a result, even if the solar cell module expands and contracts repeatedly, the terminals 221 and 231 return to the pre-expansion positions shown in FIG. 6.

Figure 8:
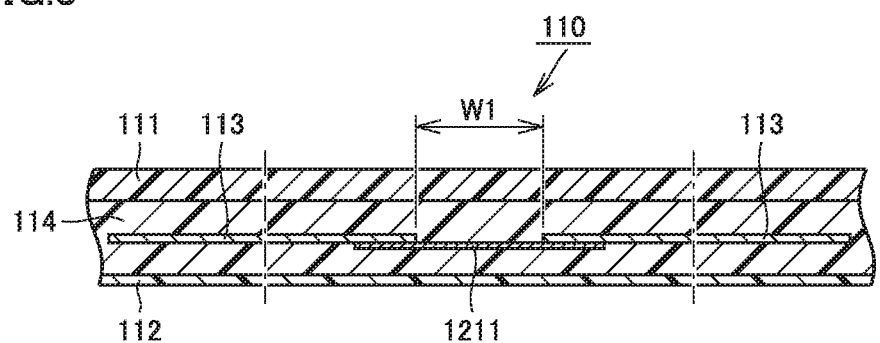
FIG. 8 is a sectional view of a solar cell module in an initial state according to a comparative example.

Referring to FIG. 8, in a solar cell module 310 not provided with bosses, an interconnector 1211 is provided between adjacent solar cells 113.

Figure 9:
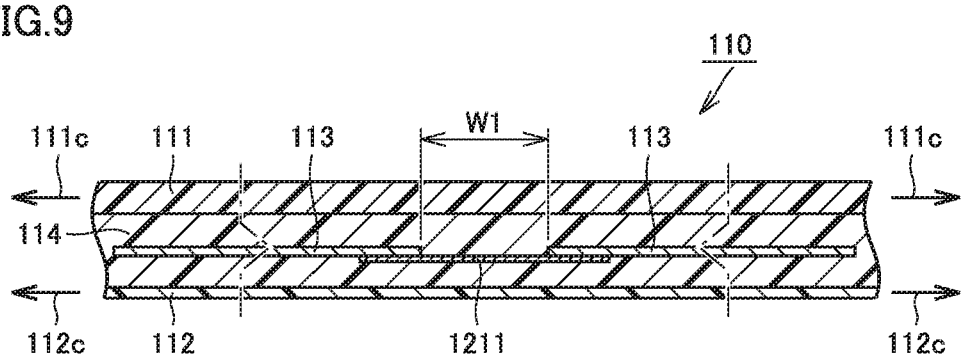
FIG. 9 is a sectional view of the solar cell module in an expanded state according to the comparative example.

Referring to FIG. 9, during a lamination process, the first cover 111 and the second cover 112 are heated to approximately 140° C. As a result, the sealing material 114 melts, the first cover 111 expands in the direction indicated by the arrow 111c, and the second cover 112 expands in the direction indicated by the arrow 112c.

Figure 10:
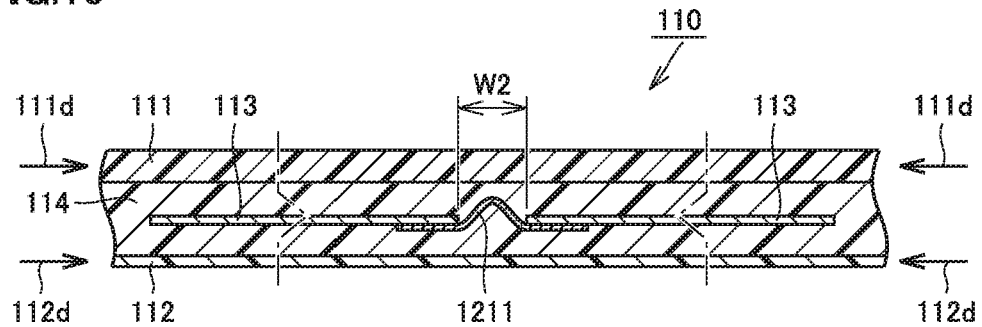
FIG. 10 is a sectional view of the solar cell module in a contracted state according to the comparative example.

Referring to FIG. 10, after the lamination process, the temperature of the solar cell module 110 is lowered to room temperature (approximately 20° C.). As a result, the sealing material 114 solidifies, the first cover 111 contracts in the direction indicated by the arrow 111d, and the second cover 112 contracts in the direction indicated by the arrow 112d. As a result, the distance between the pair of solar cells 113 is shortened. The interconnectors 211, 212 and 213 are deformed.

In the solar cell module 110 configured as described above, the bosses 121a are provided such that the interconnectors 211, 212 and 213 move as the first cover 111 and the second cover 112 expand and contract. Furthermore, since the pairs of terminals 221 and 231 connected to the legs 211a and 213a by welding are provided with the through holes 221a and 231a, the solar cells 113 do not move to the center as the first cover 111 and the second cover 112 expand and contract. As a result, the interconnectors 211, 212, 213, the terminals 221, 231, and the solar cells 113 can be reliably positioned using the bosses 121a.

Furthermore, in the manufacturing process, the terminals 221 and 231 are disposed on the first cover 111. At this time, the bosses 121a fit in the through holes 221a and 231a. The second cover 112 can be disposed in this state, so that the terminals 221 and 231 can be reliably positioned in the manufacturing process. Furthermore, the terminals 221 and 231 are not displaced relative to the first cover 111, thereby increasing manufacturing efficiency.

(Second Embodiment)

Figure 11:
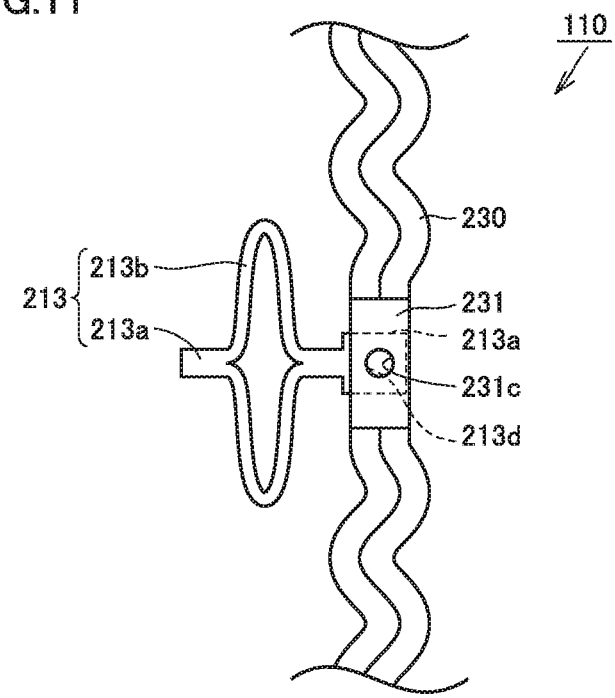
FIG. 11 is a plan view showing a tab line in a solar cell module according to a second embodiment of the present invention.

FIG. 11 is a plan view showing a tab line in a solar cell module according to a second embodiment of the present invention. Referring to FIG. 11, in the solar cell module 110 according to the second embodiment, the leg 213a is provided under the terminal 231. A through hole 213d in the leg 213a is provided under a through hole 231c in the terminal 231. A boss (not shown) is provided to extend through these through holes 231c and 213d.

In the solar cell module 110 thus configured, both the terminal 231 and the leg 213a are positioned by the boss. As a result, the respective elements are reliably positioned.

In this case, the tab line 230 may be directly connected to the leg 213a of the interconnector 213 without providing the terminal 231. The step of connecting the leg 213a and the terminal 231 can be omitted by not providing the terminal 231.

(Third Embodiment)

Figure 12:
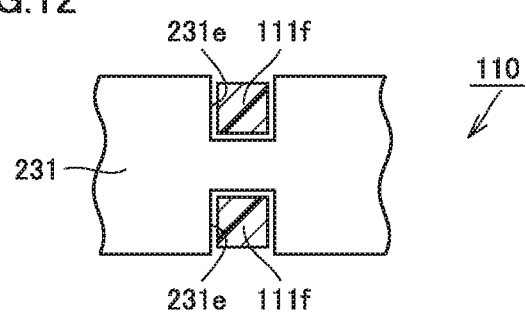
FIG. 12 is a plan view showing a positioning structure in a solar cell module according to a third embodiment of the present invention.

FIG. 12 is a plan view showing a positioning structure in a solar cell module according to a third embodiment of the present invention. Referring to FIG. 12, in the solar cell module 110 according to the third embodiment, the terminal 231 is provided with recesses 231e. Fitting portions 111f are provided as positioning units to fit in the recesses 231e. The fitting portions 111f are fixed to either the first cover 111 or the second cover 112.

In the solar cell module 110 thus configured, the fitting portions 111f fit in the recesses 231e, so that the terminal 231 can be positioned.

(Fourth Embodiment)

Figure 13:
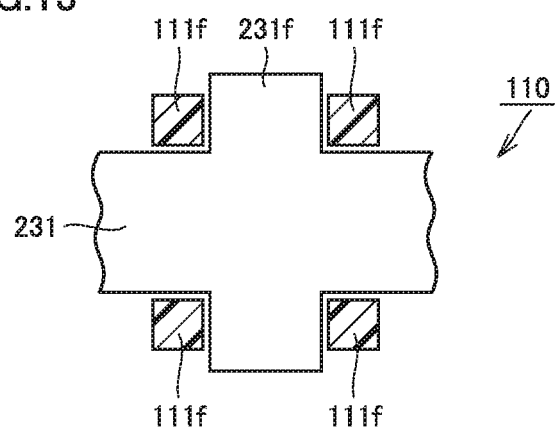
FIG. 13 is a plan view showing a positioning structure in a solar cell module according to a fourth embodiment of the present invention.

FIG. 13 is a plan view showing a positioning structure in a solar cell module according to a fourth embodiment of the present invention. Referring to FIG. 13, in the solar cell module 110 according to the fourth embodiment, the terminal 231 is provided with projections 231f The fitting portions 111f are provided as positioning units to fit with the projections 231f The fitting portions 111f are fixed to either the first cover 111 or the second cover 112.

In the solar cell module 110 thus configured, the fitting portions 111f fit with the projections 231f, so that the terminal 231 can be positioned.

Although the embodiments have been described above, the above disclosure is illustrative and non-restrictive in every respect. The technical scope of the present invention is defined by the terms of the claims, and is intended to include any modifications within the scope and meaning equivalent to the terms of the claims.

INDUSTRIAL APPLICABILITY

The present invention can be used in the field of a solar cell module mounted on a vehicle, for example.

REFERENCE SIGNS LIST 100 vehicle; 110 solar cell module; 111 first cover; 111c, 111d, 112c, 112d arrow; 111f fitting portion; 112 second cover; 113 solar cell; 114 sealing material; 120 roof side member; 121 colored portion; 121a boss; 190 chain-double-dotted line; 211, 212, 213, 1211 interconnector; 211a, 212a, 213a leg; 211b, 212b, 213b flexible portion; 213d, 221a, 231a, 231c through hole; 220, 230 tab line; 221, 231 terminal; 231e recess; 231f projection.

The invention claimed is:

1. A solar cell module comprising:
a first cover in the form of an at least partially transparent plate;
a second cover disposed opposite the first cover;
at least one solar cell disposed between the first cover and the second cover;
a sealing material which fills a space between the first cover and the second cover to join them together to thus seal the solar cell; and
conductors electrically connected to the solar cell and enclosed by the sealing material between the first cover and the second cover, wherein
at least one boss is provided between the first cover and the second cover to position the conductors,
the first cover includes a colored portion which shields inside of the first cover from outside,
the at least one boss is disposed between the colored portion and the second cover, and
the at least one boss is provided integrally with the colored portion and is in contact with the second cover.

2. The solar cell module according to claim 1, wherein
a plurality of the solar cells are connected in a row by the conductors to form a solar cell string, and
the at least one boss includes two bosses, and each of the two bosses positions a respective one of two of the conductors connected to opposite end portions of the solar cell string.

3. The solar cell module according to claim 1, wherein
a conductor of the conductors includes a through hole, and
a boss of the at least one boss is within the through hole to position the conductor.

* * * * *